United States Patent
Gelfer et al.

(10) Patent No.: US 10,329,371 B2
(45) Date of Patent: *Jun. 25, 2019

(54) SYNTACTIC POLYURETHANE ELASTOMERS FOR USE IN SUBSEA PIPELINE INSULATION

(71) Applicant: Dow Global Technologies LLC, Midland, MI (US)

(72) Inventors: Mikhail Y. Gelfer, Sugarland, TX (US); Amber Stephenson, Lake Jackson, TX (US); Venkat S. Minnikanti, Delray Beach, FL (US); Mark Brown, II, Richwood, TX (US)

(73) Assignee: Dow Global Technologies LLC, Midland, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/025,159

(22) PCT Filed: Oct. 21, 2014

(86) PCT No.: PCT/US2014/061596
§ 371 (c)(1),
(2) Date: Mar. 25, 2016

(87) PCT Pub. No.: WO2015/065769
PCT Pub. Date: May 7, 2015

(65) Prior Publication Data
US 2016/0272752 A1    Sep. 22, 2016

Related U.S. Application Data

(60) Provisional application No. 61/897,349, filed on Oct. 30, 2013.

(51) Int. Cl.
*B05D 3/00* (2006.01)
*B05D 7/00* (2006.01)
(Continued)

(52) U.S. Cl.
CPC ....... *C08G 18/485* (2013.01); *C08G 18/0876* (2013.01); *C08G 18/14* (2013.01);
(Continued)

(58) Field of Classification Search
CPC .................................. B05D 1/00; B05D 5/00
See application file for complete search history.

(56) References Cited

U.S. PATENT DOCUMENTS 3,177,902 A * 4/1965 Rubenstein ............. B28B 21/64
138/145
4,169,906 A * 10/1979 Hallstrom ............... F16L 57/06
138/110
(Continued)

FOREIGN PATENT DOCUMENTS

CN        103214648 A    7/2013
DE           299120 A    4/1992
(Continued)

OTHER PUBLICATIONS

English translation of JP2007045980 A. (Year: 2017).*

*Primary Examiner* — Dah-Wei D. Yuan
*Assistant Examiner* — Hai Y Zhang

(57) ABSTRACT

Syntactic polyurethane elastomers are made using a non-mercury catalyst. The elastomer is made from a reaction mixture containing a polymer polyol which has a liquid polyether polyol as a continuous phase and polymer particles dispersed in the liquid polyether polyol, a chain extender, a polyisocyanate and microspheres. The elastomer adheres well to itself, which makes it very useful as thermal insulation for pipelines and other structures that have a complex geometry.

8 Claims, 3 Drawing Sheets

(51) Int. Cl.
  *B05D 1/00* (2006.01)
  *B05D 5/00* (2006.01)
  *B05C 9/06* (2006.01)
  *C08J 9/32* (2006.01)
  *C08G 18/48* (2006.01)
  *C09D 175/08* (2006.01)
  *C08G 18/66* (2006.01)
  *C08G 18/76* (2006.01)
  *C08G 18/08* (2006.01)
  *C08G 18/22* (2006.01)
  *C08G 18/32* (2006.01)
  *C08G 18/40* (2006.01)
  *C23C 16/56* (2006.01)
  *F16L 59/14* (2006.01)

(52) U.S. Cl.
  CPC ....... *C08G 18/222* (2013.01); *C08G 18/3206* (2013.01); *C08G 18/4009* (2013.01); *C08G 18/409* (2013.01); *C08G 18/4816* (2013.01); *C08G 18/4841* (2013.01); *C08G 18/6674* (2013.01); *C08G 18/7657* (2013.01); *C23C 16/56* (2013.01); *F16L 59/143* (2013.01)

(56) References Cited

U.S. PATENT DOCUMENTS

| | | |
|---|---|---|
| 5,468,432 A | 11/1995 | Hurley |
| 5,563,232 A | 10/1996 | Hurley |
| 5,601,881 A * | 2/1997 | Grimm ............... B29C 47/0019 156/187 |
| 5,731,367 A | 3/1998 | Lee |
| 5,939,145 A * | 8/1999 | Oram .................. B05B 13/0228 427/231 |
| 2004/0127672 A1 | 7/2004 | Heinz |
| 2007/0100027 A1 | 5/2007 | Huntemann |
| 2009/0129853 A1* | 5/2009 | Pionetti ................. B05D 1/002 403/23 |
| 2012/0202945 A1* | 8/2012 | Schmidt ................ C08G 18/10 524/590 |
| 2012/0211916 A1* | 8/2012 | Hardwick ............ B29C 39/006 264/135 |
| 2013/0178582 A1 | 7/2013 | Krause |
| 2014/0107291 A1 | 4/2014 | Eisen |

FOREIGN PATENT DOCUMENTS

| | | |
|---|---|---|
| EP | 607834 A | 7/1994 |
| EP | 639614 A | 2/1995 |
| EP | 1375577 A | 1/2004 |
| EP | 1785445 A | 5/2007 |
| EP | 2399946 A | 12/2011 |
| JP | 2007045980 A * | 2/2007 |
| WO | 2001/032791 A | 5/2001 |
| WO | 2012/006264 A | 1/2012 |
| WO | 2012/126934 A | 9/2012 |
| WO | 2013/002974 A | 1/2013 |

* cited by examiner (Comparative)

(Comparative)

SYNTACTIC POLYURETHANE ELASTOMERS FOR USE IN SUBSEA PIPELINE INSULATION

This invention relates to syntactic polyurethane elastomers useful as subsea pipe and architecture insulation.

Subsea pipelines are used globally to deliver petroleum and/or natural gas from subsea wellhead collection facilities at the ocean surface. Cold sea temperatures can cause solid waxes and hydrates to form as the production fluids are pumped to the surface. This problem is ameliorated by applying a thermally-insulating layer to the exterior of the pipe.

Rigid polyurethane foams are widely used as thermal insulation. These are commonly made by reacting a polyisocyanate with a curing agent in the presence of a blowing gas. The blowing gas becomes trapped in cells in the foam. The trapped gas is largely responsible for the thermal insulation properties of the foam. In most applications, the polyurethane insulating foams are rigid materials. However, a highly rigid polyurethane is unsuitable as subsea pipeline insulation, because its mechanical strength is not sufficient to withstand high pressures typically encountered in subsea applications. The foam densifies and can collapse under the pressure of the seawater, and the densified material is a poor thermal insulator. In addition, the material is too brittle to withstand bending the pipeline undergoes during production, installation and use. An elastomeric insulating material is needed.

Therefore, so-called "syntactic" elastomers have been developed for the subsea pipeline applications. The syntactic elastomers contain hollow microspheres embedded in an elastomeric polyurethane matrix. The microspheres are generally made of glass or other hard material that can withstand the high undersea pressures.

The polyurethane matrix is a reaction product of a polyisocyanate, a "polyol" component and a "chain extender". The "polyol" is typically a polyether having 2 to 4 hydroxyl groups and an equivalent weight per hydroxyl group of 1000 to 6000. The "chain extender" is typically a diol having an equivalent weight of up to about 125. 1,4-butanediol is the most commonly used chain extender in these applications. The polyol, chain extender and polyisocyanate are mixed and cured in the presence of the microspheres to form the syntactic foam.

The curing reaction requires a catalyst to obtain reasonable production rates. For decades, the catalyst of choice has been an organomercury type, phenylmercury neodecanoate. This organomercury catalyst has many benefits. It provides a very useful curing profile. Reaction systems containing this organomercury catalyst react slowly at first and build viscosity gradually for a period of time. This characteristic provides valuable "open time", during which the reaction mixture can be degassed and introduced into the mold or other place where it is to be cured. After this slow initial cure, the polymerization rate accelerates, so curing times are reasonably short.

Polyurethanes made using organomercury catalysts also have very good physical properties.

The organomercury catalysts are coming under regulatory pressure, and there is now a desire to replace them with different catalysts. Although a very wide range of materials is known to catalyze the curing reaction, it has proven to be very difficult to duplicate the performance of the organomercury catalysts. Many catalysts fail to provide the favorable curing profile of organomercury catalysts. Even when the curing profile can be approximated using alternative catalysts, the good physical properties obtained using organomercury catalysts have proven to be difficult to duplicate.

One catalyst that has found use in syntactic polyurethane elastomer applications is a mixture of a zinc carboxylate and a small amount of a zirconium carboxylate. This catalyst provides a curing profile similar to, but not quite as beneficial as, the organomercury catalysts. However, a very significant and previously unknown problem has been found when using this catalyst. The applied syntactic elastomer tends to crack. The cracking problem can be quite pronounced when the substrate has a complex exterior geometry such as pipe segments when the substrate is branched or contains external surface features.

Another problem seen when using non-organomercury catalysts is that the polyurethane does not bond well to itself. This is a very significant shortcoming. It is common to apply the thermal insulation in multiple layers or to apply the thermal insulation to different portions of the substrate at different times. A bondline is formed where the separate layers or sections come into contact. Even when a single layer of polyurethane insulation is applied, bondlines can form when the reaction mixture divides into multiple flow fronts as it flows around the part and the separate flow fronts meet. When the polyurethane does not adhere to itself very strongly, cracks appear at the bondlines. This leads to a loss of thermal insulation efficiency and can expose the underlying substrate to the corrosive effects of seawater.

What is needed in the art is a method of making a syntactic polyurethane elastomer, which does not contain a mercury catalyst, which is resistant to cracking even when cast in confined complex geometries and which bonds well to itself.

This invention is in one aspect a cured syntactic polyurethane elastomer which is a reaction product of a reaction mixture comprising one or more polyether polyols including at least one polymer polyol having a continuous phase of a liquid polyether polyol having a hydroxyl equivalent weight of at least 800 and dispersed polymer particles, the dispersed polymer particles constituting 1 to 50 wt.-% of based on the combined weight of the particles and all polyether polyol(s) in the reaction mixture, 5 to 50 weight percent of microspheres based on the total weight of the reaction mixture, 1 to 30 parts by weight of a hydroxyl-terminated chain extender per 100 parts by weight of the polyether polyol(s), an aromatic polyisocyanate in amount to provide an isocyanate index of 80 to 130 and a non-mercury catalyst, wherein the reaction mixture is essentially devoid of mercury compounds.

The invention is also a method for making a syntactic polyurethane elastomer, comprising a) forming a reaction mixture containing at least one polymer polyol having a continuous phase containing one or more polyether polyols including a liquid polyether polyol having a hydroxyl equivalent weight of at least 800 and dispersed polymer particles, the dispersed polymer particles constituting 1 to 50 wt.-% of the combined weight of the particles and all polyether polyol(s) in the reaction mixture, 5 to 50 weight percent of microspheres based on the total weight of the reaction mixture, 1 to 30 parts by weight of a hydroxyl-terminated chain extender per 100 parts by weight of the polyether polyol(s), an aromatic polyisocyanate in amount to provide an isocyanate index of 80 to 130 and a non-mercury catalyst, wherein the reaction mixture is essentially devoid of mercury compounds, and b) curing the reaction mixture to form the syntactic polyurethane elastomer.

The process of the invention is suitable for applying a syntactic polyurethane elastomer to a substrate. Substrates of interest are parts that require thermal insulation. Subsea pipe and architecture is a substrate of particular interest.

An important advantage of this invention is that the syntactic polyurethane elastomer adheres well to itself and to other cured polyurethane elastomers. This is an especially important advantage when multiple sections of the syntactic polyurethane elastomer are applied to a substrate, these sections are in contact with each other, and good bonding between the sections is wanted. Thus, in certain embodiments, the invention is a process for producing a substrate having an applied syntactic polyurethane elastomer. This process comprises the steps of a) forming a first section of syntactic polyurethane elastomer on at least a portion of the substrate by (i) applying a first reaction mixture containing one or more polyether polyols including at least one polymer polyol having a continuous phase of a liquid polyether polyol having a hydroxyl equivalent weight of at least 800 and dispersed polymer particles, the dispersed polymer particles constituting 1 to 50 wt.-% of the combined weight of the particles and all polyether polyol(s) in the reaction mixture, 5 to 50 weight percent of microspheres based on the total weight of the reaction mixture, 1 to 30 parts by weight of a hydroxyl-terminated chain extender per 100 parts by weight of the polyether polyol(s), an aromatic polyisocyanate in amount to provide an isocyanate index of 80 to 130 and a non-mercury catalyst to at least a portion of the substrate, wherein the first reaction mixture is substantially devoid of mercury compounds, and (ii) at least partially curing the first reaction mixture to form the first section of syntactic polyurethane elastomer, and then b) forming a second section of syntactic polyurethane elastomer on at least a portion of the substrate by (i) applying a second reaction mixture containing one or more polyether polyols including at least one polymer polyol having a continuous phase of a liquid polyether polyol having a hydroxyl equivalent weight of at least 800 and dispersed polymer particles, the dispersed polymer particles constituting 1 to 50 wt.-% of the combined the weight of particles and all polyether polyol(s) in the reaction mixture, 5 to 50 weight percent of microspheres based on the total weight of the reaction mixture, 1 to 30 parts by weight of a hydroxyl-terminated chain extender per 100 parts by weight of the polyether polyol(s), an aromatic polyisocyanate in amount to provide an isocyanate index of 80 to 130 and a non-mercury catalyst to at least a portion of the substrate and in contact with the first section of syntactic polyurethane elastomer to form at least one bondline between the first section of syntactic polyurethane elastomer and the second reaction mixture, wherein the second reaction mixture is substantially devoid of mercury compounds, and (ii) at least partially curing the second reaction mixture to form the second section of syntactic polyurethane elastomer adherent to the first section of syntactic polyurethane elastomer.

Figure 1:
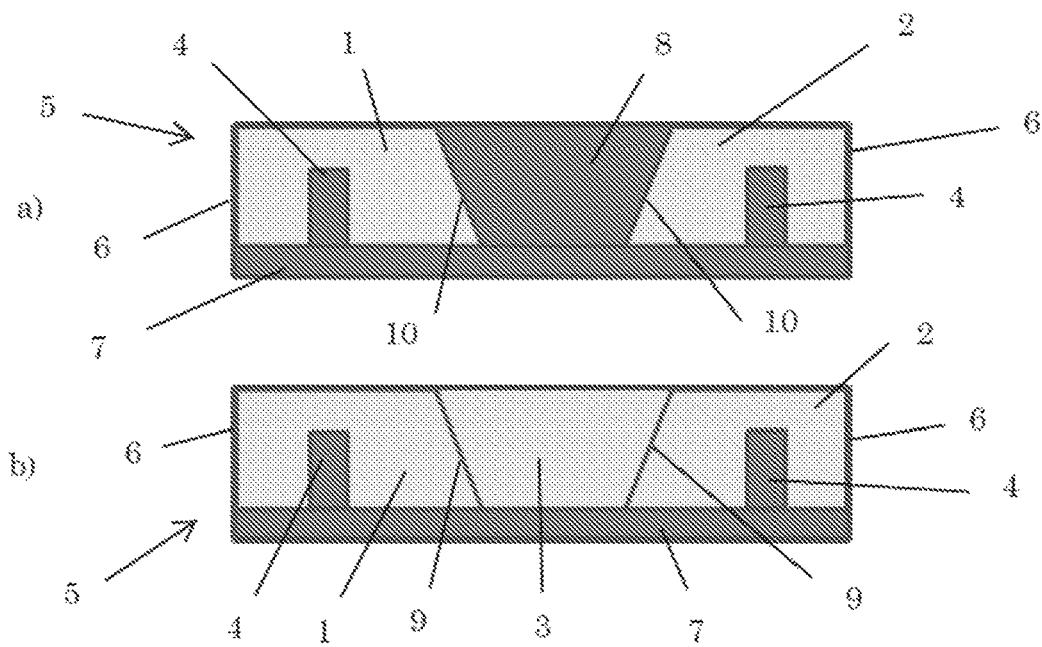
FIG. 1 is a front view, in section, of a mold for making samples for bond strength testing.

The polymer polyol has a continuous phase of a liquid polyether polyol having a hydroxyl equivalent weight of at least 800 dispersed polymer particles. The dispersed polymer particles constitute, 1 to 50 wt.-%, preferably 5 to 25 wt.-%, of, the combined weight of the particles and all polyether polyol(s) in the reaction mixture.

The hydroxyl equivalent weight of the polyether polyol preferably is at least 1500 and is preferably up to 3000.

The polyether polyol(s) preferably have a nominal functionality of 2 to 6, preferably 2 to 4 and more preferably 2 to 3. The "nominal functionality" of a polyether polyol refers to the average number of oxyalkylatable groups per molecule on the initiator compound(s) used to make the polyether polyol. Actual functionalities may be somewhat lower than nominal functionalities in some instances.

Initiators that are useful for producing the polyether polyol(s) include, for example, water, ethylene glycol, diethylene glycol, triethylene glycol, 1,2-propane diol, dipropylene glycol, tripropylene glycol, glycerin, trimethylolpropane, trimethylolethane, pentaerythritol and other aliphatic polyalcohols having a hydroxyl equivalent weight up to about 400. Primary and secondary amines are also useful initiators but may cause the polyols to be more reactive than desired, so hydroxyl-containing initiators are preferred.

A preferred polyether polyol is prepared by adding propylene oxide and ethylene oxide to a difunctional or trifunctional initiator to produce a polyol having a hydroxyl equivalent weight of 1500 to 2500, especially 1800 to 2200, and containing 5 to 30% by weight polymerized ethylene oxide. The polymerized ethylene oxide may be randomly polymerized with the propylene oxide, may form one or more internal blocks and/or, most preferably, may form terminal blocks that result in primary hydroxyl groups.

An especially preferred type of polyether polyol is made by homopolymerizing propylene oxide or randomly copolymerizing 75-99.9 weight percent propylene oxide and 0.1 to 25 weight percent ethylene oxide onto a trifunctional initiator, and optionally capping the resulting polyether with up to 30% by weight (based on total product weight) ethylene oxide to form a polyether polyol having an equivalent weight of at least 1000. This polyol preferably has an equivalent weight of 1000 to 3000, especially 1500 to 2500.

The dispersed polymer particles may be, for example, polyurea, polyurethane, or a polymer of one or more vinyl monomers. The vinyl monomers can be, for example, various polyolefins (such as polymers and copolymers of ethylene), various polyesters, various polyamides, various polycarbonates, various polymers and copolymers of acrylic and/or methacrylic esters, a homopolymer or copolymer of styrene and the like. In some embodiments, the dispersed particles are styrene-acrylonitrile copolymer particles. The dispersed particles in some embodiments have particle sizes from 100 nm to 25 mm, more typically from 250 nm to 10 mm.

The dispersed polymer particles preferably are grafted onto at least a portion of the polyether polyol molecules that form the continuous phase.

Dispersions of polyurea particles can be prepared by reacting a primary or secondary amine with a polyisocyanate in the presence of the polyether polyol. Methods for producing polyurea dispersions are described, for example, in WO 2012/154831.

Dispersions of polyurethane particles can be prepared by reacting a low equivalent weight polyol or aminoalcohol with a polyisocyanate in the presence of the polyether polyol. Methods for producing such dispersions are described, for example, in U.S. Pat. No. 4,305,857, WO 94/20558, WO 2012/154820.

Dispersions of polymerized vinyl monomers can be prepared by the in situ polymerization of such monomers in the polyether polyol. Such methods are described, for example, U.S. Pat. Nos. 4,513,124, 4,588,830, 4,640,935 and 5,854, 386. Alternatively, dispersions of this type can be formed in a melt dispersion process, in which a previously-formed vinyl polymer is melted and dispersed into the polyether polyol. Methods of this type are described in U.S. Pat. No. 6,613,827 and WO 2009/155427.

The polymer polyol may be produced at a higher solids level and then diluted with additional polyether polyol to bring the solids content down to the aforementioned ranges. The additional polyether polyol can be the same as or different than that used to prepare the higher solids polyether polyol. The additional polyether polyol can be added as a separate component of the reaction mixture that is cured to form the syntactic polyurethane elastomer.

For purposes of this invention, a chain extender is one or more compounds having two to three hydroxyl groups and a hydroxyl equivalent weight of up to 125. A preferred type of chain extender is an aliphatic glycol or glycol ether. The aliphatic glycol is a straight-chain or branched alkane having two hydroxyl groups. The glycol ether is a straight-chain or branched aliphatic ether or polyether. The hydroxyl equivalent weight preferably is up to 100 and more preferably up to 75. The hydroxyl groups are preferably on different carbon atoms. The chain extender more preferably is a straight-chain compound in which the carbon atoms are bonded to the terminal carbon atoms. Examples of chain extenders are ethylene glycol, 1,2-propylene glycol, 1,3-propane diol, 1,4-butane diol, 1,6-hexanediol, diethylene glycol, triethylene glycol, dipropylene glycol, tripropylene glycol, glycerin, trimethylol propane, trimethylolethane, or an alkoxylate of any of the foregoing having an equivalent weight of up to 125. Preferred among these are the α,ω-alkylene glycols such as ethylene glycol, 1,3-propane diol, 1,4-butane diol and 1,6-hexane diol. 1,4-butanediol is especially preferred.

A preferred amount of chain extender is 5 to 25 parts by weight for 100 parts by weight of the polyether polyol. A still more preferred amount is 10 to 20 parts by weight on the same basis.

The aromatic polyisocyanate may be, for example, m-phenylene diisocyanate, 2,4- and/or 2,6-toluene diisocyanate (TDI), the various isomers of diphenylmethanediisocyanate (MDI), naphthylene-1,5-diisocyanate, methoxyphenyl-2,4-diisocyanate, 4,4'-biphenylene diisocyanate, 3,3'-dimethoxy-4,4'-biphenyl diisocyanate, 3,3'-dimethyldiphenylmethane-4,4'-diisocyanate, 4,4',4"-triphenylmethane triisocyanate, polymethylene polyphenylisocyanates, hydrogenated polymethylene polyphenylisocyanates, toluene-2,4,6-triisocyanate, and 4,4'-dimethyl diphenylmethane-2,2',5,5'-tetraisocyanate. Preferred polyisocyanates have an average of 1.9 to 2.3 isocyanate groups per molecule, especially from 2 to 2.2 isocyanate groups per molecule and an isocyanate equivalent weight of 125 to 200. The aromatic polyisocyanates may contain uretondione, uretonimine, isocyanurate, biuret, allophonate, carbodiimide, urethane or urea linkages.

Especially preferred polyisocyanates are diphenylmethane diisocyanate (MDI), including the 2,4'-, 2,2'- and 4,4'-isomers or mixtures of two or more of such isomers, "polymeric" MDI products which include a mixture of MDI and one or more polymethylene polyphenylisocyanates, and modified MDI products that contain uretondione, uretonimine, isocyanurate, biuret, allophonate, carbodiimide, urethane or urea linkages and have an isocyanate equivalent weight of 130 to 200.

A preferred isocyanate index is 90 to 125, and a still more preferred isocyanate index is 90 to 115.

The catalyst is a non-mercury catalyst, by which is meant a catalyst that does not contain mercury compounds other than possibly as a trace impurity (constituting no more than 0.1% by weight of the weight of the catalyst). The catalyst (and the amount used) preferably is selected to provide a slow initial reaction for a period of 1 to 10 minutes, followed by an accelerated cure. The catalyst may be a thermally activated type, such as an encapsulated or blocked type.

Various types of amines and metal urethane catalysts are useful, including, for example, certain tertiary phosphines such as a trialkylphosphine or dialkylbenzylphosphine; chelates of metals such as Be, Mg, Zn, Cd, Pd, Ti, Zr, Al, Sn, As, Bi, Cr, Mo, Mn, Fe, Co and Ni; metal salts of strong acids, such as ferric chloride, stannic chloride, stannous chloride, antimony trichloride, bismuth nitrate and bismuth chloride; strong bases, such as alkali and alkaline earth metal hydroxides, alkoxides and phenoxides; alcoholates or phenolates of various metals, such as $Ti(OR)_4$, $Sn(OR)_4$ and $Al(OR)_3$, wherein R is alkyl or aryl, and the reaction products of the alcoholates with carboxylic acids, beta-diketones and 2-(N,N-dialkylamino)alcohols; alkaline earth metal, Bi, Pb, Sn or Al carboxylate salts; and tetravalent tin compounds, and certain tri- or pentavalent bismuth, antimony or arsenic compounds. Also useful are blocked amine catalysts as described in WO 2013/04333, copper catalysts as described in WO 2012/06263, zinc catalysts as described in WO 2012/06264, and substituted bicyclic amidine catalysts as described in WO 2013/002974.

A preferred catalyst is a zinc carboxylate catalyst. The zinc carboxylate catalyst is a zinc salt of a carboxylic acid. The carboxylic acid is preferably a monocarboxylic acid having 2 to 24, preferably 2 to 18, more preferably 6 to 18 and especially 8 to 12, carbon atoms. A mixture of carboxylates may be present.

All or a portion of the zinc carboxylate catalyst may engage in a rearrangement to form species which contain Zn—O—Zn linkages. These species are considered as zinc carboxylates for purposes of this invention.

The preferred zinc carboxylate catalyst may be used by itself or in combination with one or more other metal carboxylate catalysts. The other metal may be, for example, a group 3-12 metal other than mercury. The zinc carboxylate preferably constitutes at least 90 weight percent, at least 99 weight percent or at least 99.9 weight percent of such a mixture. A particularly useful catalyst mixture is a mixture of 98-99.99 weight percent of one or more zinc carboxylates and 0.01 to 2 weight percent of one or more zirconium carboxylates. Such a mixture may contain small amounts (up to 5 weight percent, more preferably up to 0.5 weight percent and even more preferably up to 0.01 weight percent) of other metal (other than mercury) carboxylates.

The amount of zinc carboxylate catalyst may be 0.01 to 1 part, preferably 0.01 to 0.5 part and more preferably 0.01 to 0.2 parts per 100 parts by weight polyether polyol.

In some embodiments, no nitrogen-containing catalyst, tin catalyst, or other catalyst for the reaction of polyol groups with isocyanate groups is present. The reaction mixture is also essentially devoid of mercury compounds, preferably containing no more than 0.01 weight percent mercury, more preferably containing no more than 0.001 weight percent mercury.

The microspheres consist of a shell, which encapsulates either a vacuum or a gas. The shell is approximately spherical. It defines a hollow space, which contains the encapsulated vacuum or gas. The gas may be, for example, air, nitrogen, oxygen, hydrogen, helium, argon, a hydrocarbon or other gas. The shell is capable of withstanding the pressures encountered during the use of the syntactic polyurethane elastomer. The shell may be, for example, glass or other ceramic. The microspheres are generally of the non-expandable type. Non-expandable types are preferred. The microspheres may have a density of, for example, 0.1 to 0.6 g/cc. The particle size preferably is such that at least 90 volume percent of the microspheres have a diameter of 5 to 100 μm, preferably 10 to 60 μm. Glass microspheres are preferred. Suitable microspheres include commercially available products such as 3M™ Microspheres from 3M Corporation and Expancel™ microspheres from Akzo Nobel.

The microspheres constitute 5 to 50 weight percent, preferably 15 to 30 weight percent of the reaction mixture and the resulting syntactic polyurethane elastomer.

Upon curing, the microspheres become embedded in a polyurethane matrix that forms in the curing reaction. Apart from the presence of the microspheres themselves, the polyurethane matrix is preferably non-cellular, as a cellular material becomes easily crushed under high submarine pressures. Accordingly, the reaction mixture preferably has at most very small quantities (such as up to 0.5% by weight in total) of water or other chemical or physical blowing agent. Preferably, physical blowing agents and chemical blowing agents other than water are not added into the reaction mixture. Commercially available polyether polyols often contain small amounts, such as up to 0.25 weight percent, of water, and this water may be carried into the reaction mixture with the polyether polyol(s). Other starting materials may contain similarly small amounts of water. It is preferred, however, not to add water in addition to that (if any) carried in with the raw materials and it is in any case preferred that the reaction mixture contains no more than 0.25 weight percent water, preferably no more than 500 parts per million, based on the entire weight of the reaction mixture.

Moreover, it is preferred to include one or more components that function to help prevent foaming. One such component is a water scavenger, i.e., a material that adsorbs or absorbs water or otherwise ties up any water as may be present and thereby reduce the ability of that water to react with isocyanates during the curing reaction. Zeolites, molecular sieves, fumed silica and other desiccants can be used for this purpose. An anti-foam agent of various types can be used. The anti-foam agent acts to destabilize any gas bubbles as may form in the reaction mixture and cause them to collapse. Water scavengers and anti-foam agents are typically used in small amounts, such as 0.1 to 5 parts by weight per 100 parts by weight of the polyether polyol.

The reaction mixture may contain one or more isocyanate-reactive materials in addition to the chain extender and the polyether polyol described above. However, such isocyanate-reactive materials, if used at all, are preferably used in small amounts, such as up to 5 parts by weight total per 100 parts by weight of the polyether polyol and more preferably up to 2 parts or up to 0.5 parts by weight total per 100 parts by weight of the polyether polyol. Examples of additional isocyanate-reactive materials of this type are polyester polyols, polyether polyols having equivalent weights of less than 1000, crosslinkers (compounds having 3 or more hydroxyl groups or 1 or more primary or secondary amino groups and an equivalent weight of up to 250), and the like.

Other optional ingredients include epoxy resins, particulate fillers (in addition to the microspheres), fibers, reinforcing agents, colorants, biocides, preservatives and antioxidants. Fillers, fibers and reinforcing agents may be used in weights up to 200 parts per 100 parts by weight polyether polyol, but preferably are used in small quantities, such as up to 50 parts or up to 20 parts by weight per 100 parts by weight polyether polyol, and may be omitted entirely. Colorants, biocides, preservatives and antioxidants preferably are used in very small quantities, such as up to 5 or up to 2 parts by weight per 100 parts by weight polyether polyol, if used at all.

Another optional ingredient is a ß-diketone compound. The ß-diketone is a compound in which two keto groups are separated by a methylene group, including compounds having the structure:

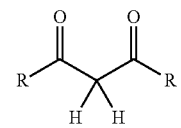

wherein each R is independently hydrocarbyl or inertly substituted hydrocarbyl. Preferably, each R is independently an alkyl group, which may be linear, branched or cyclic, which may by aryl-substituted or otherwise inertly substituted. More preferably, each R is independently an alkyl group (linear, branched or cyclic) having 1 to 8, especially 1 to 4 carbon atoms.

Examples of ß-diketone compounds are acetylacetone (pentane-2,4-dione), hexane-2,4-dione, heptane-3,5-dione, 2,2,6,6-tetramethyl-3,5-heptanedione, and the like.

The presence of a ß-diketone compound has been found to improve the bond between multiple sections of the syntactic polyurethane elastomer, when such sections are formed sequentially as described below. The bond strength is in some cases increased very substantially when the ß-diketone compound is present. Additionally, when the ß-diketone compound is included in the reaction mixture, the bond line, when visualized microscopically at a magnification of 100×, is often seen to have fewer defects, compared to when the ß-diketone compound is not present in an otherwise identical formulation, to the point that no defects are visible under such magnification. The bondline in some cases is no longer visible under such magnification. This effect is seen especially when the non-mercury catalyst is a zinc carboxylate catalyst.

The ß-diketone compound may constitute, for example, at least 0.05, at least 0.06, or at least 0.10 to 1% of the combined weight of all components of the reaction mixture except the polyisocyanate(s). In some embodiments, the ß-diketone constitutes up to 0.5% or up to 0.25% of such weight. A preferred amount is 0.06 to 0.5%. A more preferred amount is 0.10 to 0.25% and a still more preferred amount is 0.1 to 0.2%, on the same basis as before.

Alternatively, the amount of the ß-diketone compound can be expressed in terms of the amount of non-mercury catalyst, particularly when the non-mercury catalyst is a metal catalyst. The weight of ß-diketone compound may be, for example, 1 to 10, preferably 1 to 5, more preferably 2 to 5 and still more preferably 3 to 4 times that of the metal non-mercury catalyst(s).

Still another optional ingredient is an epoxy resin, which may constitute, for example 1 to 15, preferably 3 to 10 and more preferably 3 to 7 percent of the combined weight of all ingredients except the polyisocyanate(s). The presence of the epoxy resin has been found to produce smaller hard segment domains, which in turn is believed to have a beneficial effect on the ability of the syntactic polyurethane elastomer to adhere to itself. Epoxy resins include, for example, glycidyl ethers of bisphenols, epoxy novolac resins, epoxy cresol resins, and the like, especially those having an epoxy equivalent weight of up to 500 or up to 250.

A syntactic polyurethane elastomer is formed by mixing the various components and allowing them to cure. It is often convenient to formulate the components into a polyol component which contains the polyether polyol and chain extender (and any other isocyanate-reactive species, as may be present) and a separate isocyanate component that contains the polyisocyanate(s). Other ingredients can be formulated into either the polyol or isocyanate component, although it is typical to formulate most or all of these into the polyol component. To make the polyurethane, the polyol component and isocyanate component are mixed at proportions sufficient to provide an isocyanate index as indicated above, and allowed to cure.

The components can be heated when the polyisocyanate and isocyanate-reactive materials are mixed, or can be mixed at ambient temperature. Preheating can be to 30 to 100° C., for example. The components are generally cured in a mold; the mold can be preheated if desired to a similar temperature. Heat can be applied throughout the curing process if desired, but this is not always necessary or desirable, as the curing reaction is exothermic. Curing is performed until the syntactic polyurethane elastomer has developed enough strength to be demolded without permanent damage or distortion. Once demolded, the syntactic polyurethane elastomer can be post-cured if desired.

The cured syntactic elastomer includes a polyurethane matrix formed in the curing action, in which the microspheres are embedded. The content of microspheres will generally be essentially the same as the content of microspheres in the reaction mixture. As before, the polyurethane matrix preferably is non-cellular apart from the presence of the embedded microspheres.

The invention has particular advantages in applications in which multiple sections of the syntactic polyurethane elastomer are applied to a substrate, such that the successively-applied sections meet and form a bondline. In such embodiments, a first reaction mixture as described herein is applied to the substrate and at least partially cured to form a first section of syntactic polyurethane elastomer. The curing in this step is continued until the polymer has developed enough green strength to be demolded (if in a mold) or otherwise to maintain its shape during subsequent operations. Then, a second reaction mixture as described herein is applied to the substrate and in contact with the first section of syntactic polyurethane elastomer. This forms a bondline between the first section of syntactic polyurethane elastomer and the second reaction mixture. The second reaction mixture is then at least partially cured to form the second section of syntactic polyurethane elastomer adherent to the first section of syntactic polyurethane elastomer. The bond strength at the bondline is preferably at least 5 MPa, more preferably at least 6 MPA and still more preferably at least 8 MPa, as measured by ASTM D638, modified such that the test sample contains the bondline.

The foregoing process can be extended to any number of applied sections.

The individual sections may cover all or only a portion of the substrate. The second and any successive sections may be applied on top of the first section, to form a multilayer syntactic polyurethane coating. Alternatively, the different sections may be applied to adjacent portions of the substrate such that the later-applied section(s) come into contact with one or more earlier-applied section(s) to form a bondline. By "bondline", it is meant the point or points at which the sections are in contact with each other.

Pipelines (including subsea pipelines or land pipelines) and subsea architecture are substrates of particular interest to this invention. Such a substrate can be made of any material that is suitable for its intended use, provided it can withstand the temperatures of the polyurethane-curing process. Polymeric and ceramic materials can be used to make the substrate, and these materials can be reinforced if desired. The preferred materials of construction for pipelines and subsea architecture are metals, especially steel. The substrate may also be coated with a corrosion inhibiting material, including, for example, fusion-bonded epoxy, thermally-sprayed aluminum, a liquid-curable epoxy resin, and the like, prior to being coated with thermal insulation.

Pipe segments may be, for example, 1 to 20 meters in length, and 2 centimeters to 2 meters in diameter. The pipe segments may have diameters of at least 10 centimeters or at least 15 centimeters, and may have diameters up to 1 meter, up to 0.5 meters or up to 0.35 meters. The applied coating of syntactic polyurethane elastomer may be 1 to 25 centimeters thick and is preferably 2.5 to 10.2 centimeters thick. The ends of the pipe segments may be flanged or otherwise adapted (via various fittings, for example) to be joined to an adjacent pipe segment to produce a joint between the adjacent pipe segments.

The pipe or undersea architecture may be linear or have a more complex structure. It may be, for example, branched, curved or have other non-linear configurations. It may have external features that protrude partially or completely through the applied syntactic polyurethane elastomer section(s). Another significant advantage of this invention is that the syntactic polyurethane elastomer section(s) are very resistant to cracking at or near branch points and at or near sites at which protrusions partially or completely through the layer(s). Prior to this invention, this performance has been difficult to achieve without using mercury catalysts.

For pipe and undersea architecture applications, the syntactic polyurethane elastomer may be applied in thicknesses of 2.5 to 20 cm, especially 5 to 12 cm. These thicknesses are usually sufficient to provide the necessary thermal insulation.

The following examples are provided to illustrate the invention and are not intended to limit the scope thereof. All parts and percentages are by weight unless indicated otherwise.

EXAMPLE 1 AND COMPARATIVE SAMPLES A AND B

The Polyether Polyol is a nominally trifunctional polyether made by adding propylene oxide and then ethylene oxide to a trifunctional initiator. The Polyether Polyol contains about 15% ethylene oxide by weight. It contains mainly primary hydroxyl groups and has a hydroxyl equivalent weight of about 2050.

The Polymer Polyol is a graft dispersion of styrene-acrylonitrile particles in the Polyether Polyol. The Polymer Polyol contains about 40% by weight of the dispersed styrene-acrylonitrile particles.

The Zn/Zr catalyst is a mixture of zinc and zirconium carboxylates in which the weight ratio of zinc to zirconium is 99-99.5:0.5-1. The catalyst contains some species having M-O-M linkages, wherein M stands for the metal, i.e. either Zn or Zr.

The organomercury catalyst is a commercial grade of phenylmercury neodecanoate.

The microspheres are 3M grade S38HS glass microspheres.

Polyisocyanate A is a modified MDI having an isocyanate equivalent weight of 163 and an isocyanate functionality of about 2.1.

Polyurethane Elastomer Example 1 and Comparative Samples A and B are made from the formulations set forth in Table 1.

TABLE 1

| Ingredient (parts by weight) | Comp. A* | Comp. B* | Ex. 1 |
| --- | --- | --- | --- |
| Polyether Polyol | 62.4 | 62.6 | 47 |
| Copolymer Polyol | 0 | 0 | 15.6 |
| 1,4-Butanediol | 10.6 | 10.6 | 11.8 |
| Organomercury catalyst | 0.35 | 0 | 0 |
| Zn/Zr catalyst | 0 | 0.03 | 0.03 |
| Acetylacetone | 0 | 0.18 | 0.18 |
| Water scavenger | 2.5 | 2.5 | 2.5 |
| Antifoam agent | 0.02 | 0.02 | 0.02 |
| Microspheres | 23.6 | 23.6 | 23.6 |
| Polyisocyanate A | To 104 index | To 104 index | To 104 index |
| % Dispersed polymer particles, based on polyether polyols | 0 | 0 | 10% |

Note:
for purposes of this invention, the mixture of the Polyether Polyol and Copolymer Polyol are together considered as the "polymer polyol" component; i.e., in Example 1, the Copolymer Polyol is considered to have been diluted with the Polyether Polyol to form a polymer polyol in which the solids content is 10% by weight.

Syntactic polyurethane elastomers are made from each of these formulations. The polyol, chain extender, water scavenger and antifoam agent are mixed on a laboratory mixer, followed by the catalyst and microspheres. The polyisocyanate is then mixed in. The resulting reaction mixture is then poured into sections 1 and 2 of the mold illustrated in FIG. 1 and allowed to cure. As shown in FIG. 1, mold 5 includes base 7 and walls 6 which define a mold cavity. The overall mold length is 317 mm. Risers 4 extend upward from base 7 22 mm from each end through the depth (from front-to-rear, as shown in FIG. 1) of the mold cavity. Risers 4 are 22 mm high and 25 mm wide. Removable insert 8 rests in the mold cavity, dividing the mold cavity into two sections (designated by reference numerals 1 and 2 in FIG. 1), which are mirror images of each other. Insert 8 has a trapezoidal cross-section, and extends across the entire depth of the mold cavity. The top and bottom surfaces of insert 8 are 153 and 58 mm long, respectively. Walls 10 of insert 8 rise from base 7 at about an angle of about 45° from horizontal.

To make Example 1, the reaction mixture poured into sections 1 and 2 is cured isothermally at 50° C. For Comparative Samples A and B, the curing temperatures are 70 and 120° C., respectively. After this curing step, insert 8 is removed from the mold. This leaves two sections of cured elastomer in the mold, one residing in section 1 of the mold cavity and the second residing in section 2 of the mold cavity. The space occupied previously by insert 8 (designated as section 3 in FIG. 1b) is now unfilled. A fresh batch of the reaction mixture is prepared, poured into section 3 and cured as before.

Figure 2:
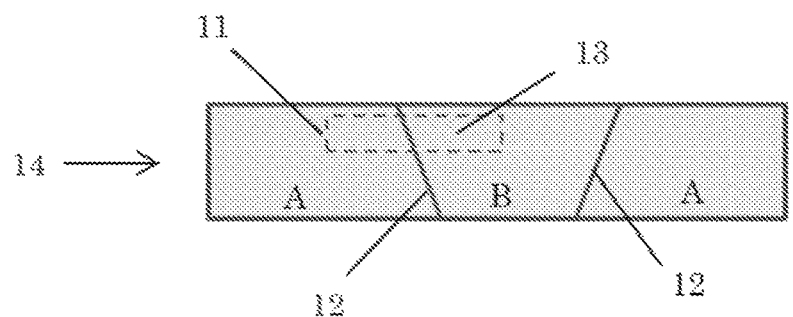
FIG. 2 is a front view of a tripartite elastomer for bond strength testing.

The resulting syntactic polyurethane elastomer in each case consists of three sections, as shown in FIG. 2. Syntactic polyurethane elastomer 14 includes two sections A, which correspond, respectively, to sections 1 and 2 of the mold cavity. Section B corresponds to section 3 of the mold cavity. Bondlines 12 exist at the interface between Section B and each Section A.

Figure 3:
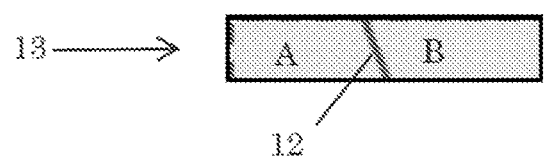
FIG. 3 is a front view of a test sample for bond strength testing.

To test the adhesion of Section B to an adjacent Section A, test specimen 13 is cut from elastomer 14 along dotted line 11 (FIG. 2). As shown in FIG. 3, test specimen 13 includes a portion of Section B and one of Sections A of elastomer 14, and includes a portion of one of the bondlines 12.

For each of the samples, the strength of bondline 12 is evaluated according to ASTM D638, modified to use the test sample containing the bondline. The ultimate stress at failure is taken as an indication of the bond strength between the adjacent sections of each sample. Results are as indicated in Table 2.

TABLE 2

| Designation | Bond Strength, MPa |
| --- | --- |
| Comparative Sample A | 9.5 |
| Comparative Sample B | 3.1 |
| Example 1 | 11.0 |

Comparative Sample A represents a traditional system based on a mercury catalyst. The data for Comparative Sample A represents a baseline case. When the mercury catalyst is replaced with the Zn/Zr catalyst (Comparative Sample B), the bond strength is reduced by two-thirds. Example 2 shows the effect of using a polymer polyol. Bond strength exceeds the level obtained with the mercury catalyst, even though the Zn/Zr catalyst is used.

Figure 4:
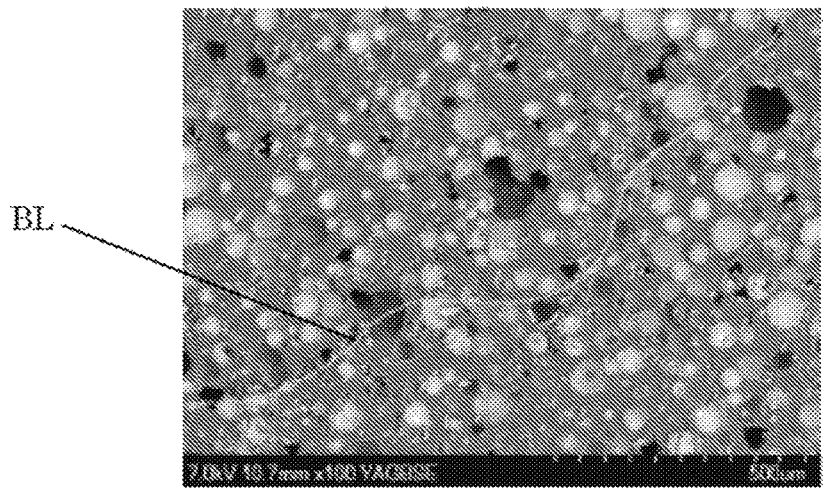
FIG. 4 is a micrograph of a prior art syntactic polyurethane elastomer.
Figure 5:
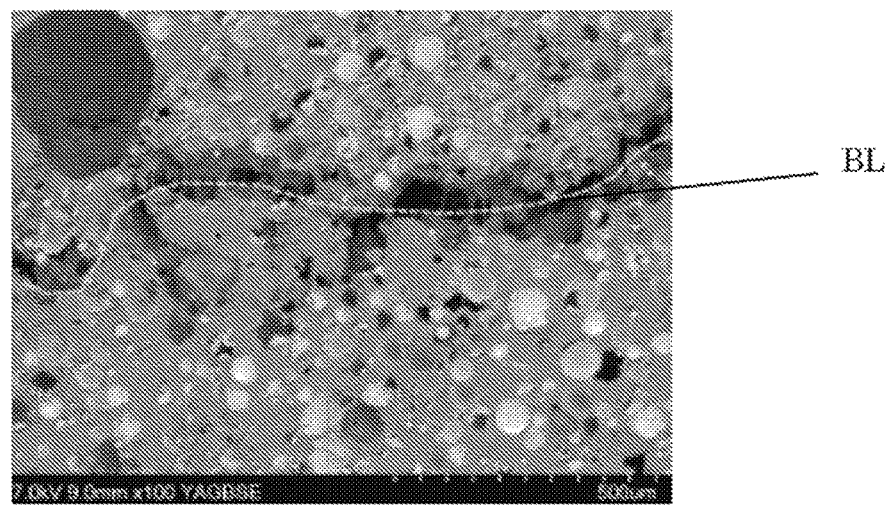
FIG. 5 is a micrograph of a prior art syntactic polyurethane elastomer.
Figure 6:
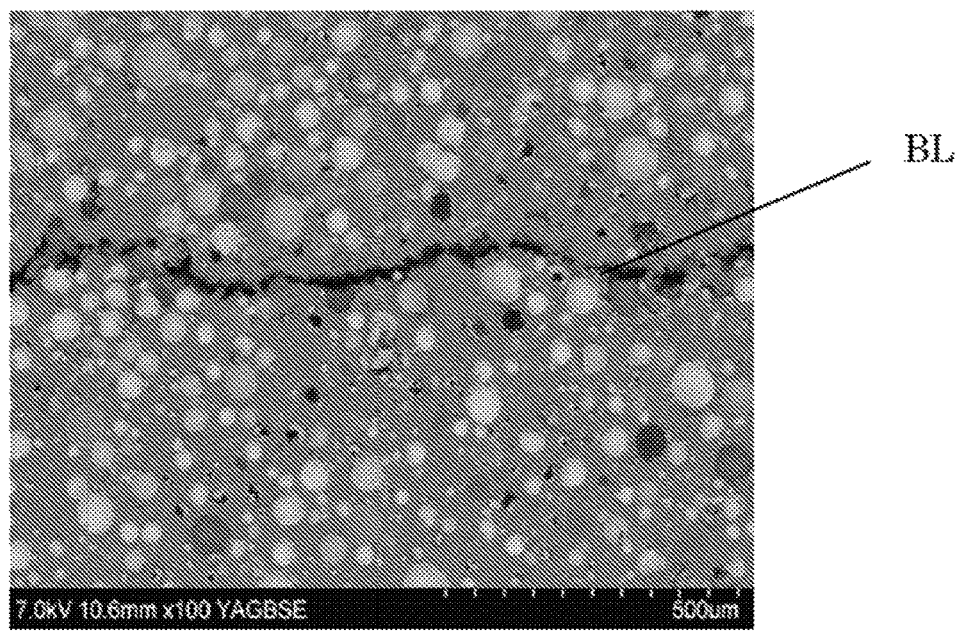
FIG. 6 is a micrograph of a syntactic polyurethane elastomer of the invention.

As a further evaluation of the bondline, micrographs are taken of each of Comparative Samples A and B and Example 1. These micrographs form FIGS. 4-6, respectively. As seen in FIG. 4, almost no noticeable bond line is seen when the system is catalyzed with an organomercury catalyst (the location of the bondline is indicated in each of FIGS. 4-6 by line "BL"). Comparative Sample B exhibits a wide bondline with poor adhesion, as seen in FIG. 5. This shows that the substitution of the mercury catalyst with the Zn/Zr catalyst does not allow one to approach the results obtained using the mercury catalyst. As FIG. 6 shows, the separation at bondline in Example 1 is insignificant, more closely resembling that of Comparative Sample A than Comparative Sample B. FIG. 6 shows the effect of using the polymer polyol to provide dispersed polymer particles; substantial improvement in the bondline is seen, despite using the Zn/Zr catalyst which is shown in Comparative Sample B to lead to a poorer bondline in the absence of the polymer polyol. The defects in the bondline have an importance apart from their potential effect on bond strength, which may be small in a given case. The defects create pathways for water penetration during use in subsea applications (as well as others in which the coated substrate may be immersed). The water penetration over time can lead to hydrolysis of the polyurethane, debonding of the polyurethane from the substrate, corrosion of the underlying substrate, and loss of thermal insulation effect of the coating, among other problems.

SPECIFIC EMBODIMENTS

In specific embodiments, the invention is:
1. A cured syntactic polyurethane elastomer which is a reaction product of a reaction mixture comprising one or more polyether polyols including at least one polymer polyol having a continuous phase of a liquid polyether polyol having a hydroxyl equivalent weight of at least 800 and dispersed polymer particles, the dispersed polymer particles constituting 1 to 50 wt.-% of based on the combined weight of the particles and all polyether polyol(s) in the reaction mixture, 5 to 50 weight percent of microspheres based on the total weight of the reaction mixture, 1 to 30 parts by weight of a hydroxyl-terminated chain extender per 100 parts by weight of the polyether polyol(s), an aromatic polyisocyanate in amount to provide an isocyanate index of 80 to 130 and a non-mercury catalyst, wherein the reaction mixture is essentially devoid of mercury compounds.

2. The preceding embodiment, wherein the cured syntactic elastomer comprises a polyurethane matrix in which the microspheres are embedded.

3. Any preceding embodiment, wherein the cured syntactic elastomer forms a coating on a substrate.

4. A process for making a syntactic polyurethane elastomer, comprising
forming a reaction mixture containing at least one polymer polyol having a continuous phase containing one or more polyether polyols including a liquid polyether polyol having a hydroxyl equivalent weight of at least 800 and dispersed polymer particles, the dispersed polymer particles constituting 1 to 50 wt.-% of the combined weight of the particles and all polyether polyol(s) in the reaction mixture, 5 to 50 weight percent of microspheres based on the total weight of the reaction mixture, 1 to 30 parts by weight of a hydroxyl-terminated chain extender per 100 parts by weight of the polyether polyol(s), an aromatic polyisocyanate in amount to provide an isocyanate index of 80 to 130 and a non-mercury catalyst, wherein the reaction mixture is essentially devoid of mercury compounds, and
b) curing the reaction mixture to form the syntactic polyurethane elastomer.

5. Embodiment 4, wherein in step b) is performed on the surface of a substrate to form a coating of the syntactic polyurethane elastomer on the substrate.

6. A process for producing a substrate having an applied syntactic polyurethane elastomer, comprising the steps of
a) forming a first section of syntactic polyurethane elastomer on at least a portion of the substrate by (i) applying a first reaction mixture containing one or more polyether polyols including at least one polymer polyol having a continuous phase of a liquid polyether polyol having a hydroxyl equivalent weight of at least 800 and dispersed polymer particles, the dispersed polymer particles constituting 1 to 50 wt.-% of the combined weight of the particles and all polyether polyol(s) in the reaction mixture, 5 to 50 weight percent of microspheres based on the total weight of the reaction mixture, 1 to 30 parts by weight of a hydroxyl-terminated chain extender per 100 parts by weight of the polyether polyol(s), an aromatic polyisocyanate in amount to provide an isocyanate index of 80 to 130 and a non-mercury catalyst to at least a portion of the substrate, wherein the first reaction mixture is substantially devoid of mercury compounds, and (ii) at least partially curing the first reaction mixture to form the first section of syntactic polyurethane elastomer, and then
b) forming a second section of syntactic polyurethane elastomer on at least a portion of the substrate by (i) applying a second reaction mixture containing one or more polyether polyols including at least one polymer polyol having a continuous phase of a liquid polyether polyol having a hydroxyl equivalent weight of at least 800 and dispersed polymer particles, the dispersed polymer particles constituting 1 to 50 wt.-% of the combined the weight of particles and all polyether polyol(s) in the reaction mixture, 5 to 50 weight percent of microspheres based on the total weight of the reaction mixture, 1 to 30 parts by weight of a hydroxyl-terminated chain extender per 100 parts by weight of the polyether polyol(s), an aromatic polyisocyanate in amount to provide an isocyanate index of 80 to 130 and a non-mercury catalyst to at least a portion of the substrate and in contact with the first section of syntactic polyurethane elastomer to form at least one bondline between the first section of syntactic polyurethane elastomer and the second reaction mixture, wherein the second reaction mixture is substantially devoid of mercury compounds, and (ii) at least partially curing the second reaction mixture to form the second section of syntactic polyurethane elastomer adherent to the first section of syntactic polyurethane elastomer.

7. Embodiment 6, wherein the reaction mixture is essentially devoid of mercury compounds.

8. Embodiment 6 or 7, wherein the bondline has a bond strength of at least 5.0 MPa.

9. Embodiment 8, wherein the bondline has a bond strength of at least 8.0 MPa.

10. Any of embodiments 6-9, wherein the bondline is not visible under a magnification of 100×, and/or has no visible defects when visualized microscopically at a magnification of 100×.

11. Any of embodiments 4-10 wherein the substrate is a pipe (for subsea or land use) or undersea architecture.

12. Embodiment 11, wherein the pipe (for subsea or land use) or undersea architecture is branched, curved or has another non-linear configuration.

13. Embodiment 11 or 12, wherein the pipe (for subsea or land use) or undersea architecture has one or more external features that protrude partially or completely through the applied syntactic polyurethane elastomer.

14. Any preceding embodiment, wherein the polymer polyol is a graft dispersion of polyurea or polyurethane particles in the polyether polyol.

15. Any of embodiments 1-13, wherein the polymer polyol is a graft dispersion of particles of a vinyl polymer in the polyether polyol.

16. Embodiment 15, wherein the polymer polyol is a graft dispersion of particles of a homopolymer of polystyrene or a copolymer of styrene and acrylonitrile in the polyether polyol.

17. Any preceding embodiment, wherein the polyether polyol is prepared by adding propylene oxide and ethylene oxide to a difunctional or trifunctional initiator to produce a polyol having a hydroxyl equivalent weight of 1500 to 2500 and containing 5 to 30% by weight polymerized ethylene oxide, wherein the polymerized ethylene oxide is randomly polymerized with the propylene oxide and the polymerized ethylene oxide forms one or more internal blocks and/or forms terminal blocks that result in primary hydroxyl groups.

18. Any of embodiments 1-16, wherein the polyether polyol is made by homopolymerizing propylene oxide or randomly copolymerizing 75-99.9 weight percent propylene oxide and 0.1 to 25 weight percent ethylene oxide onto a trifunctional initiator, and optionally capping the resulting polyether with up to 30% by weight (based on total product weight) ethylene oxide to form a polyether polyol having an equivalent weight of 1500 to 2500.

19. Any preceding embodiment, wherein the chain extender is 1,4-butanediol.

20. Any preceding embodiment, wherein the non-mercury catalyst includes a zinc carboxylate.

21. Any preceding embodiment, wherein the reaction mixture contains 15 to 30 weight percent microspheres.

22. Any preceding embodiment, wherein in the cured syntactic polyurethane elastomer, the microspheres are dispersed in a non-cellular polyurethane matrix.

23. Any preceding embodiment, wherein the reaction mixture contains no more than 500 parts by weight of water per million parts by weight of the reaction mixture.

24. Any preceding embodiment, wherein the reaction mixture contains a ß-diketone compound.

25. Embodiment 24, wherein the ß-diketone is a compound having the structure:

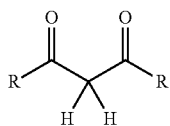

wherein each R is independently hydrocarbyl or inertly substituted hydrocarbyl.

26. Embodiment 25, wherein each R is independently a linear, branched or cyclic alkyl group having 1 to 4 carbon atoms.

27. Embodiment 24, wherein the ß-diketone compound is one or more of acetylacetone (pentane-2,4-dione), hexane-2,4-dione, heptane-3,5-dione and 2,2,6,6-tetramethyl-3,5-heptanedione.

28. Any of embodiments 24-28, wherein the ß-diketone compound constitutes 0.05 to 1% of the combined weight of all components of the reaction mixture except the polyisocyanate(s).

29. Embodiment 28, wherein the ß-diketone compound constitutes 0.1 to 0.25% of the combined weight of all components of the reaction mixture except the polyisocyanate(s).

30. Any of embodiments 24-30, wherein the non-mercury catalyst is one or more metal catalyst(s), and the weight of the ß-diketone compound 1 to 10 times that of the metal non-mercury catalyst(s).

31. Embodiment 30, wherein the non-mercury catalyst is one or more metal catalyst(s), and the weight of the ß-diketone compound 2 to 5 times that of the metal non-mercury catalyst(s).

32. Embodiment 30, the non-mercury catalyst is one or more metal catalyst(s), and the weight of the ß-diketone compound 3 to 4 times that of the metal non-mercury catalyst(s).

33. Any preceding embodiment, wherein the reaction mixture contains at least one water scavenger.

What is claimed is:

1. A process for producing a substrate having an applied syntactic polyurethane elastomer, comprising the steps of
   a) forming a first section of syntactic polyurethane elastomer on at least a portion of the substrate by (i) applying a first reaction mixture containing one or more polyether polyols including at least one polymer polyol having a continuous phase of a liquid polyether polyol having a hydroxyl equivalent weight of at least 800 and dispersed polymer particles, the dispersed polymer particles constituting 1 to 50 wt. % of the combined weight of the particles and all polyether polyol(s) in the reaction mixture, 5 to 50 weight percent of microspheres based on the total weight of the reaction mixture, 1 to 30 parts by weight of a hydroxyl-terminated chain extender per 100 parts by weight of the polyether polyol(s), an aromatic polyisocyanate in amount to provide an isocyanate index of 80 to 130, 0.10 to 0.25 wt. % based on the combined weight of all components of the reaction mixture except the aromatic polyisocyanate of a β-diketone compound, and a zinc carboxylate catalyst to at least a portion of the substrate, wherein the first reaction mixture is devoid of mercury compounds, and (ii) partially curing the first reaction mixture to maintain its shape to form the first section of syntactic polyurethane elastomer, and then
   b) forming a second section of syntactic polyurethane elastomer on at least a portion of the substrate by (i) applying a second reaction mixture containing one or more polyether polyols including at least one polymer polyol having a continuous phase of a liquid polyether polyol having a hydroxyl equivalent weight of at least 800 and dispersed polymer particles, the dispersed polymer particles constituting 1 to 50 wt. % of the combined the weight of particles and all polyether polyol(s) in the reaction mixture, 5 to 50 weight percent of microspheres based on the total weight of the reaction mixture, 1 to 30 parts by weight of a hydroxyl-terminated chain extender per 100 parts by weight of the polyether polyol(s), an aromatic polyisocyanate in amount to provide an isocyanate index of 80 to 130, 0.10 to 0.25 wt. % based on the combined weight of all components of the reaction mixture except the aromatic polyisocyanate of a β-diketone compound, and a zinc carboxylate catalyst to at least a portion of the substrate and in contact with the first section of syntactic polyurethane elastomer to form at least one bondline between the first section of syntactic polyurethane elastomer and the second reaction mixture, wherein the second reaction mixture is devoid of mercury compounds, and (ii) at least partially curing the second reaction mixture to form the second section of syntactic polyurethane elastomer adherent to the first section of syntactic polyurethane elastomer, wherein the bondline has a bond strength of at least 8.0 MPa, as measured according to ASTM D638.

2. The process of claim 1 wherein the substrate is an undersea pipe or undersea architecture.

3. The process of claim 2 wherein the undersea pipe or undersea architecture is branched, curved or has another non-linear configuration.

4. The process of claim 2 wherein the undersea pipe or undersea architecture has one or more external features that protrude partially or completely through the applied syntactic polyurethane elastomer.

5. The process of claim 1 wherein the polymer polyol is a graft dispersion of polyurea or polyurethane particles in the polyether polyol.

6. The process of claim 1 wherein the polymer polyol is a graft dispersion of particles of a homopolymer of polystyrene or a copolymer of styrene and acrylonitrile in the polyether polyol.

7. The process of claim 1, wherein the polyether polyol is one or more of (A) a polyether polyol prepared by adding propylene oxide and ethylene oxide to a difunctional or trifunctional initiator to produce a polyol having a hydroxyl equivalent weight of 1500 to 2500 and containing 5 to 30% by weight polymerized ethylene oxide, based on total product weight, wherein the polymerized ethylene oxide is randomly polymerized with the propylene oxide and the polymerized ethylene oxide forms one or more internal blocks and/or forms terminal blocks that result in primary hydroxyl groups or (B) a polyether polyol is made by homopolymerizing propylene oxide or randomly copolymerizing 75-99.9 weight percent propylene oxide and 0.1 to 25 weight percent ethylene oxide onto a trifunctional initiator, and optionally capping the resulting polyether with up to 30% by weight {based on total product weight} ethylene oxide to form a polyether polyol having an equivalent weight of 1500 to 2500.

8. The process of claim 1, wherein the chain extender is 1,4-butanediol.

* * * * *